(12) United States Patent
Brunton et al.

(10) Patent No.: US 9,691,923 B2
(45) Date of Patent: Jun. 27, 2017

(54) APPARATUS FOR AND METHOD OF FORMING PLURAL GROUPS OF LASER BEAMS USING TWO ROTATING DIFFRACTIVE OPTICAL ELEMENTS

(71) Applicant: M-SOLV LTD., Oxford, Oxfordshire (GB)

(72) Inventors: Adam North Brunton, Headington (GB); Simon John Henley, Greater London (GB)

(73) Assignee: M-SOLV LTD., Oxford, Oxfordshire (GB)

( * ) Notice: Subject to any disclaimer, the term of this patent is extended or adjusted under 35 U.S.C. 154(b) by 0 days.

(21) Appl. No.: 14/778,469

(22) PCT Filed: Mar. 13, 2014

(86) PCT No.: PCT/GB2014/050762
§ 371 (c)(1),
(2) Date: Sep. 18, 2015

(87) PCT Pub. No.: WO2014/147375
PCT Pub. Date: Sep. 25, 2014

(65) Prior Publication Data
US 2016/0284904 A1    Sep. 29, 2016

(30) Foreign Application Priority Data

Mar. 22, 2013  (GB) .................................. 1305303.8

(51) Int. Cl.
*H01L 31/04* (2014.01)
*H01L 31/0463* (2014.01)
(Continued)

(52) U.S. Cl.
CPC ........ *H01L 31/0463* (2014.12); *B23K 26/067* (2013.01); *B23K 26/0652* (2013.01);
(Continued)

(58) Field of Classification Search
CPC .................................................. H01L 31/0463
See application file for complete search history.

(56) References Cited

U.S. PATENT DOCUMENTS

| 5,922,224 A | * | 7/1999 | Broekroelofs | ..... B23K 26/0608 |
| | | | | 219/121.72 |
| 7,157,661 B2 | | 1/2007 | Amako | |
| (Continued) | | | | |

FOREIGN PATENT DOCUMENTS

| CH | WO 2012004230 A1 * | 1/2012 | ......... B23K 26/0676 |
| CN | 102343484 A | 2/2012 | |
| (Continued) | | | |

*Primary Examiner* — Scott B Geyer
*Assistant Examiner* — S. M. S Imtiaz
(74) *Attorney, Agent, or Firm* — Harness, Dickey & Pierce, P.L.C.

(57) ABSTRACT

An apparatus for and a method of forming a plurality of groups of laser beams (2, 2', 2") are defined. Each group (2, 2', 2") may comprise two or more laser beams. The apparatus comprises a first diffractive optical element (3, referred as DOE) and a second diffractive optical element (8), the first DOE (3) being arranged to receive a first laser beam (1) and to divide this into a plurality of second laser sub-beams and the second DOE (8) being arranged to receive said plurality of second laser sub-beams and to divide each of these into two or more groups of third laser sub-beams (2, 2', 2"), the separation of the groups in a direction perpendicular to a first axis being adjustable by rotation of the first DOE (3) about its optical axis and the separation of the third laser sub-beams (2, 2', 2") within each group in a direction perpendicular to the first axis being adjustable by rotation of the second DOE (8) about its optical axis.

14 Claims, 8 Drawing Sheets

(51) Int. Cl.
  *B23K 26/06* (2014.01)
  *B23K 26/067* (2006.01)
  *G03F 7/20* (2006.01)
  *B23K 26/364* (2014.01)
  *B23K 26/402* (2014.01)
  *G02B 26/08* (2006.01)
  *H01L 31/18* (2006.01)
  *G02B 27/10* (2006.01)
  *B23K 101/40* (2006.01)
  *G02B 13/22* (2006.01)
  *G02B 27/28* (2006.01)

(52) U.S. Cl.
  CPC .......... *B23K 26/364* (2015.10); *B23K 26/402* (2013.01); *G02B 26/0808* (2013.01); *G02B 27/1093* (2013.01); *G03F 7/70383* (2013.01); *H01L 31/1876* (2013.01); *B23K 2201/40* (2013.01); *G02B 13/22* (2013.01); *G02B 26/0816* (2013.01); *G02B 27/283* (2013.01)

(56) References Cited

U.S. PATENT DOCUMENTS

| | | | |
|---|---|---|---|
| 2002/0021723 A1* | 2/2002 | Amako | B23K 26/0604 372/23 |
| 2004/0188393 A1* | 9/2004 | Li | B23K 26/04 219/121.7 |
| 2006/0000811 A1 | 1/2006 | Hogan et al. | |
| 2006/0086898 A1 | 4/2006 | Cheng et al. | |
| 2007/0099439 A1* | 5/2007 | Van Borkulo | B23K 26/0652 438/795 |
| 2014/0036331 A1* | 2/2014 | Kuge | G02B 26/10 359/216.1 |
| 2016/0008922 A1* | 1/2016 | Schwarze | B22F 3/1055 219/76.12 |

FOREIGN PATENT DOCUMENTS

| | | |
|---|---|---|
| DE | 10-2008-032-751 B3 | 12/2009 |
| EP | 1779961 A1 | 5/2007 |
| WO | WO-01-37769 A1 | 5/2001 |
| WO | WO-2012-004230 A9 | 1/2012 |

\* cited by examiner

PRIOR ART

APPARATUS FOR AND METHOD OF FORMING PLURAL GROUPS OF LASER BEAMS USING TWO ROTATING DIFFRACTIVE OPTICAL ELEMENTS

CROSS REFERENCE TO RELATED APPLICATIONS

This application is a U.S. National Phase application under 35 U.S.C. 371 of International Application No. PCT/GB2014/050762 filed on Mar. 13, 2014 and published WO 2014/147375 A1 on Sep. 25, 2014. This application claims priority to British Application No. 1305303.8 filed on Mar. 22, 2013. The entire disclosures of all of the above applications are incorporated herein by reference.

The present invention relates to methods and apparatus for splitting laser beams into several sub-beams so that multiple scribing processes can be performed in parallel. It is particularly appropriate for "one step interconnection" (OSI) processes for forming and connecting the cells on thin film solar panels because in this case multiple parallel scribes through layers of different materials need to be made.

FIG. 1 shows prior art (WO2012/004230 A9) and demonstrates how a laser beam 1 is split angularly into (in this case 4) sub-beams 2 by diffractive optical element (DOE) 3. Lens 4 is placed at an appropriate distance from the DOE such that the lens deviates all the beams 2 such that they become parallel to each other. Lens 4 focusses the beams 2 to form a line of focal spots 5 on the surface of a substrate 6. Such a line of spots can be used for scribing multiple parallel grooves in a substrate at the same time if the substrate is moved with respect to the lens and DOE combination. Such angular beam splitting by DOE is used widely for display, telecommunications and materials processing applications. The use of lenses to deviate angularly separated beams so that they become more or fully parallel is well known.

Such arrangements are used widely particularly in conjunction with 2*d* optical scanners where an incoming beam is deviated in 2*d* over a wide range of angles by galvanometer motor driven mirrors and the lens is used to focus and deviate the beams. Such lenses are generally referred to as f-theta lenses and if the output beams are parallel or close to parallel then the lenses are defined as telecentric. In general the requirement for achieving parallel output beams after the lens is that the distance between the optic centre of the lens and the galvo-scanner mirrors is equal to the focal length of the lens. If the incoming beam is collimated then the beams beyond the lens will be focussed at the focal plane of the lens. In a similar way, if DOE 3 is placed at the focal distance before the lens the beams beyond the lens will be parallel. Note that rotation of the DOE 3 about an axis parallel to the laser beam 1 causes the line of focal spots on the substrate surface to rotate. This effect is used to adjust the effective separation of the focal spots on the substrate surface in the direction perpendicular to the substrate moving direction so allowing the gap between scribe lines on the substrate surface to be readily changed.

FIG. 2 shows further prior art (U.S. Pat. No. 7,157,661) and demonstrates the use of 2 DOEs. Laser beam 1 is split angularly into (in this case 3) sub-beams 2 by first diffractive optical element (DOE) 3. DOE 3 is placed close to focussing lens 4 so that beams 2 are focussed to a line of focal spots 5 on the substrate 6. Lens 4 deviates the angularly separating beams 2 but due to the proximity of the DOE to the lens the beams 2 continue to diverge. Second DOE 7 is used to transform the profile or shape of the beam at the focal plane 5 of the lens. Without DOE 7 in place the focal spots 5 on the substrate 6 have a so called Gaussian profile. DOE 7 is used to modify the energy density distribution in the focal spots to have a different profile, such as "top-hat" that is more useful for some micro-machining applications.

A problem with the arrangements of FIGS. 1 and 2 is that the extent to which the relative separations of scribe lines can be varied is limited. A further problem is that it is difficult to use these arrangements efficiently in the context of dual stage groove formation processes in which a groove is formed by successive scanning of two or more laser spots having different properties down the groove line.

It is an object of the invention to provide apparatus and methods that at least partially address one or more of the problems with the prior art discussed above.

According to an aspect of the invention, there is provided an apparatus for forming a plurality of groups of laser beams, each group comprising two or more laser beams, the apparatus comprising a first diffractive optical element (DOE) and a second diffractive optical element (DOE), the first DOE being arranged to receive a first laser beam and to divide this into a plurality of second laser sub-beams and the second DOE being arranged to receive said plurality of second laser sub-beams and to divide each of these into two or more groups of third laser sub-beams, the separation of the groups in a direction perpendicular to a first axis being adjustable by rotation of the first DOE about its optical axis and the separation of the third laser sub-beams within each group in a direction perpendicular to the first axis being adjustable by rotation of the second DOE about its optical axis.

Thus, by providing two rotatable DOEs optically in series, both of which are configured to split any received laser beam into a plurality of angularly separated sub-beams, the apparatus makes it possible to control for example the relative separations of laser spots formed by the sub-beams on a substrate with a greater degree of flexibility than is possible with prior art arrangements of comparable simplicity of construction. In particular, the apparatus is capable of providing groups of spots in which the separation between the spots in each group can be controlled independently from the separation between the groups of spots. Furthermore, the fact that the separation between spots in each group is determined by the degree of rotation of the same first DOE for each group ensures that the spots in different groups reliably have the same spacing. Control of spot separation by rotating the first and second DOEs is cost-effective to implement and easy to control with a high level of precision.

The separation between the groups of laser beams may be measured as an angular separation, or a spatial separation, for example at the focus of a lens used to direct the beams onto a workpiece, between centres of the groups or between corresponding sub-beams within the groups (e.g. between sub-beams in different groups that have the same diffraction order). The groups may or may not overlap with each other when viewed along the first axis.

In an embodiment, the apparatus comprises a lens, for example a telecentric lens, that is arranged to receive said plurality of groups of third laser sub-beams from said second DOE. In an embodiment, the position of the lens along its optical axis is adjustable and/or is adjusted so that the groups of laser sub-beams output therefrom and the laser sub-beams within each group are substantially parallel.

In an embodiment, the apparatus further comprises a beam combiner for allowing sub-beams from a fourth laser beam to be combined with the sub-beams derived from the first laser beam (e.g. for example so the combined sub-beams are projected onto the same region of a substrate, optionally at different positions within the region). In an embodiment, a third DOE is provided and arranged to receive the fourth laser beam. In an embodiment, the fourth laser beam has at least one property (e.g. wavelength, pulse length, pulse repetition rate, pulse energy) that is different from the first laser beam. In this way, spots originated from the fourth laser beam can have a different effect on the substrate or on layers of material formed on the substrate. For example, the difference in properties may be such that at least one layer on the substrate can be removed by spots originating from one of the first and second laser beams but not by spots originating from the other. This arrangement provides enhanced flexibility, thus enabling convenient creation of a wider range of structures on the substrate. In an embodiment, the third DOE is configured to divide the fourth laser beam into a plurality of fifth laser sub-beams, the separation of the fifth laser sub-beams in a direction perpendicular to the first axis being adjustable by rotation of the third DOE about its optical axis. In an embodiment, the beam combiner is arranged to combine the groups of third laser sub-beams leaving the second DOE with said fifth laser sub-beams leaving said third DOE.

In an embodiment, the apparatus is configured such that at least one of the third laser sub-beams forms a first spot on a substrate that is substantially aligned with, but spaced apart from, a second spot formed by one of the fifth laser sub-beams in a direction parallel with said first axis. In this way, the first spot can be made to interact with the substrate, at a given position on the substrate, before the second spot, or vice versa, when the substrate is moved along the first axis. This may be useful where the first spot is configured to interact with the substrate (or layers formed thereon) in a different way to the second spot. For example, the first spot may be configured to remove a first type of layer and the second spot may be configured to remove a second type of layer, different from the first. If the first type of layer is positioned above the second type of layer it may be convenient to arrange for the first spot to interact with the substrate at a given position before the second spot so that the first type of layer can be removed to reveal the second type of layer before the second spot arrives.

In an embodiment, the apparatus further comprises a beam deflector for controlling a direction of incidence of the fourth laser beam onto the third DOE. The beam deflector may be configured for example to allow the separation between the first and second spots to be varied (either as a continuous function of position or discretely). The variation in separation may be achieved while maintaining the alignment between the first and second spots along the direction parallel with said first axis. Thus, where the substrate is configured to move along the first axis, the time difference between the first spot interacting with a given point on the substrate and the second spot interacting with the point can be varied in a controlled manner. It is also possible to change the order with which the spots interact with the substrate using the beam deflector. For example, the beam deflector can be used to cause the second spot to lag the first spot (or vice versa) for both of opposite directions of movement of the substrate by switching the relative positions of the first and second spots when the substrate changes direction.

In an embodiment, the beam deflector comprises a mirror mounted so as to be rotatable about an axis lying in a plane perpendicular to said first axis.

In an embodiment, the separation (e.g. angular separation and/or spatial separation after collimation) of the groups of sub-beams created by the first DOE, and/or of spots formed by the groups of sub-beams on a substrate, is greater than the separation of the third laser sub-beams created by the second DOE and/or of spots formed by the third laser sub-beams on a substrate. In an alternative embodiment, the separation (e.g. angular separation and/or spatial separation after collimation) of the groups of sub-beams created by the first DOE, and/or of spots formed by the groups of sub-beams on a substrate, is less than the separation of the third laser sub-beams created by the second DOE and/or of spots formed by the third laser sub-beams on a substrate.

In an embodiment, the first DOE causes a narrower splitting to input beams than the second DOE. For example, where the first and second DOEs comprise diffraction gratings, the periodicity of the first DOE may be longer than the periodicity of the second DOE. Thus, a given rotation of the first DOE will cause a smaller change in the positions of features (e.g. scribe lines) formed on a workpiece by the laser sub-beams than the same rotation of the second DOE. The first DOE therefore effectively provides a fine adjustment and the second DOE provides a coarse adjustment. This arrangement reduces the minimum size of the second DOE for a given spacing between the first and second DOEs, thereby facilitating mounting of these elements (e.g. by relaxing the requirement for the second DOE to be very close to the first DOE in order to encompass all beams output from the first DOE without being too large) and overall compactness. In other embodiments, a reverse arrangement is used in which the first DOE provides a coarse adjustment and the second DOE provides a fine adjustment.

In an embodiment, the separation between laser spots on a workpiece corresponding to the third laser sub-beams in each of one or more of the groups of third laser sub-beams is adjustable at least in the range of about 50 to 200 microns.

In an embodiment, the first and second DOEs are mounted on a first process head. In an embodiment the first process head is moveable relative to a workpiece for carrying out processing, for example direct laser scribing, of the workpiece.

In an embodiment, two or more process heads are provided. In an embodiment each of the two or more process heads is configured to carry a first and second DOE in accordance with an embodiment. In an embodiment, each of the two or more process heads are movable relative to a work piece and are configured to carry out, optionally independently, direct laser scribing of the workpiece.

In an embodiment, the apparatus comprises a first laser source configured to provide said first laser beam to said process head and/or, where provided, to two or more of multiple process heads.

In an embodiment, the apparatus comprises a second laser source configured to provide said fourth laser beam to said process head and/or, where provided, to two or more of multiple process heads.

In an embodiment, the apparatus is configured to carry out laser scribing of a thin film solar panel, for example to form an interconnect between portions thereof.

According to a further aspect, there is provided a method of forming a plurality of groups of laser beams, each group comprising two or more laser beams, the method comprising passing a first laser beam through a first diffractive optical element (DOE) to divide the first laser beam into a plurality of second laser sub-beams, passing the second laser sub-beams through a second diffractive optical element (DOE), to divide each of these into two or more groups of third laser sub-beams, the separation of the groups in a direction perpendicular to a first axis being adjusted by rotation of the first DOE about its optical axis and the separation of the third laser sub-beams in each group in a direction perpendicular to the first axis being adjusted by rotation of the second DOE about its optical axis.

In an embodiment, the rotation of the first DOE about its optical axis is used to adjust the separation of the groups of third laser sub-beams in a first direction perpendicular to the first axis and the rotation of the second DOE about its optical axis is used to adjust the separation of the third laser sub-beams in each group in the same first direction perpendicular to the first axis. Thus, relative movement between spots formed by the third laser sub-beams and a workpiece can be used to form direct laser scribe lines on the workpiece. If the relative motion is along a direction parallel to the first axis, the separation between the scribe lines can be adjusted by rotation of the first and/or second DOEs, as described above.

In an embodiment, two or more groups of third laser sub-beams are used in the fabrication of a thin film solar panel, for example to form an interconnect. In an embodiment, the third laser sub-beams in a group are used to form a plurality of parallel laser scribes in the same interconnect and the adjacent group(s) of third laser sub-beams are used to form a plurality of parallel laser scribes in one or more adjacent interconnects.

Embodiments of the invention will now be described, by way of example only, with reference to the accompanying drawings in which corresponding reference symbols represent corresponding parts, and in which.

FIG. 3

Figure 1:
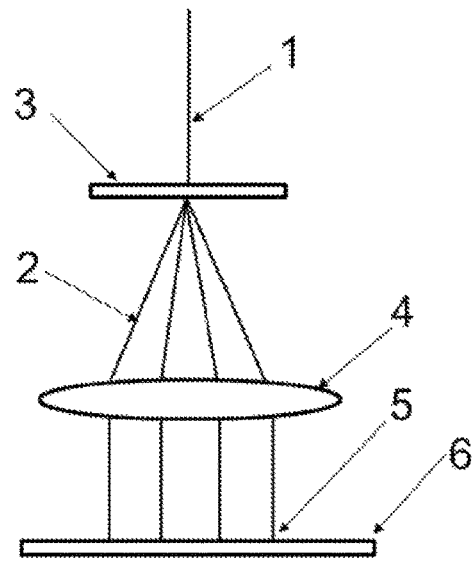
FIG. 1 depicts a prior art arrangement for splitting a laser beam using a single DOE.
Figure 2:
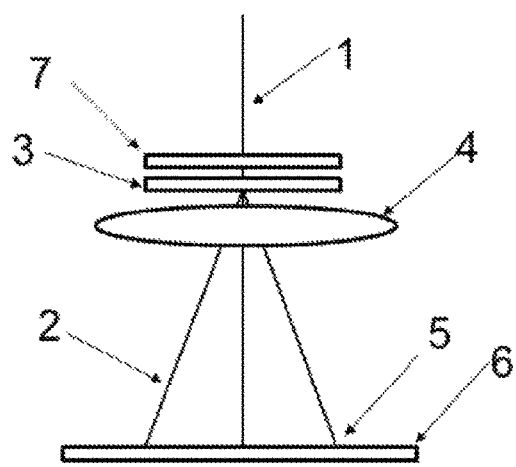
FIG. 2 depicts a prior art arrangement that uses a first DOE to split a laser beam and a second DOE to transform the shape of the beams output from the first DOE.
Figure 3:
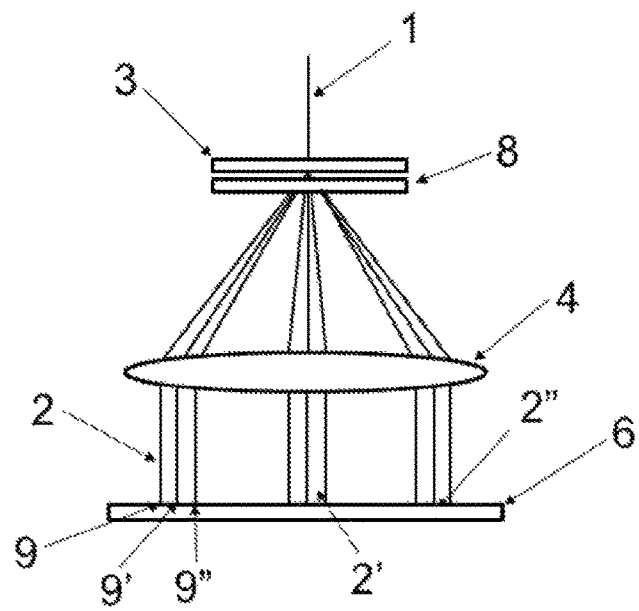
FIG. 3 depicts an apparatus for forming a plurality of groups of laser beams comprising first and second individually rotatable DOEs and a lens for collimating the output from the two DOEs.

FIG. 3 depicts an apparatus for forming a plurality of groups of laser beams according to an embodiment. In this embodiment, a first DOE 3 is provided to split first laser beam 1 into multiple second laser sub-beams and a second DOE 8 is provided, close to first DOE 3, to split each of the second laser sub-beams into multiple third sub-beams. Lens 4 is situated at an appropriate distance from DOE 3 and DOE 8 such that all beams beyond lens 4 are parallel or close to parallel and are all focussed to create a row of groups of focal spots on the substrate surface 6 the separation between the groups in this particular embodiment being larger than the separation between the spots within each group. The figure shows 3 groups 2, 2' and 2" each having 3 focal spots 9, 9' and 9" but in practice there can be more or less groups (e.g. 4 or 2). In the embodiment shown, there are 3 spots within each group, which may be convenient for example for OSI requirements, but in practice the number could be more or less (e.g. 4 or 2).

FIG. 4

Figure 4:
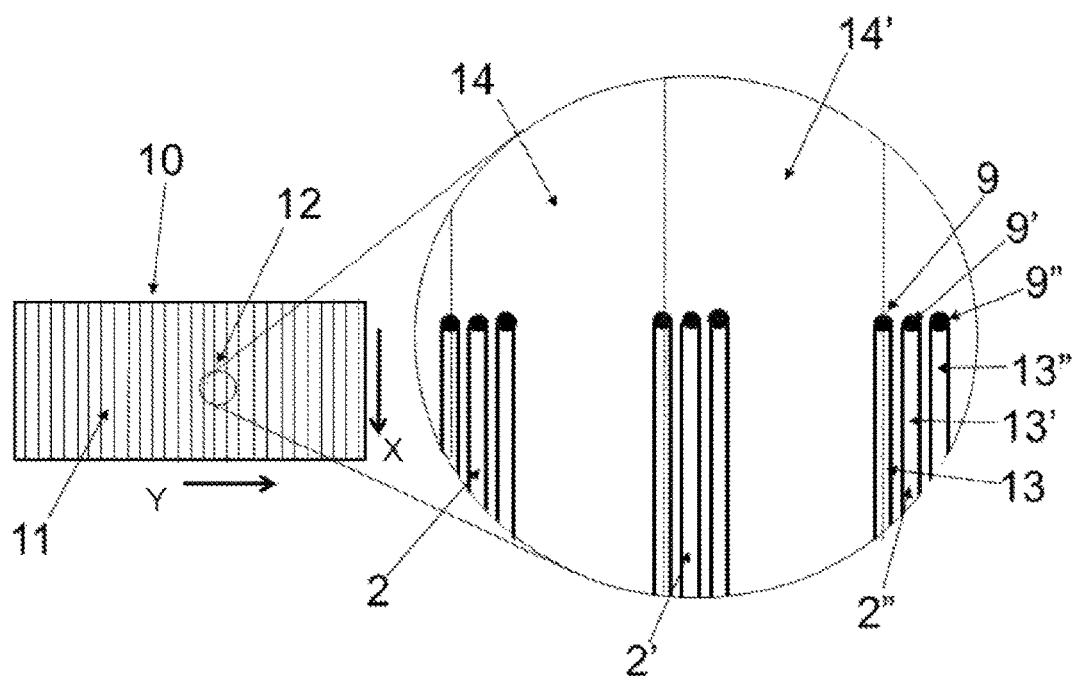
FIG. 4 depicts an example arrangement of spots output from the apparatus of FIG. 3.

FIG. 4 illustrates an example arrangement of the groups of spots formed by an apparatus such as that depicted in FIG. 3 and which could be used for example in an OSI application for forming and interconnecting cells on a thin film solar panel. Thin film solar panel 10 is divided into multiple parallel cells 11 which are electrically interconnected in series. Area 12 on the panel containing part of 3 interconnections is expanded on the right side of the figure to show 3 groups of focal spots 2, 2' and 2" each group containing 3 focal spots 9, 9' and 9". Movement of the panel in the X direction causes the each group of beams to scribe grooves 13, 13' and 13" in the thin film layers on the panel to create cells 14 and 14'.

FIG. 5

Figure 5:
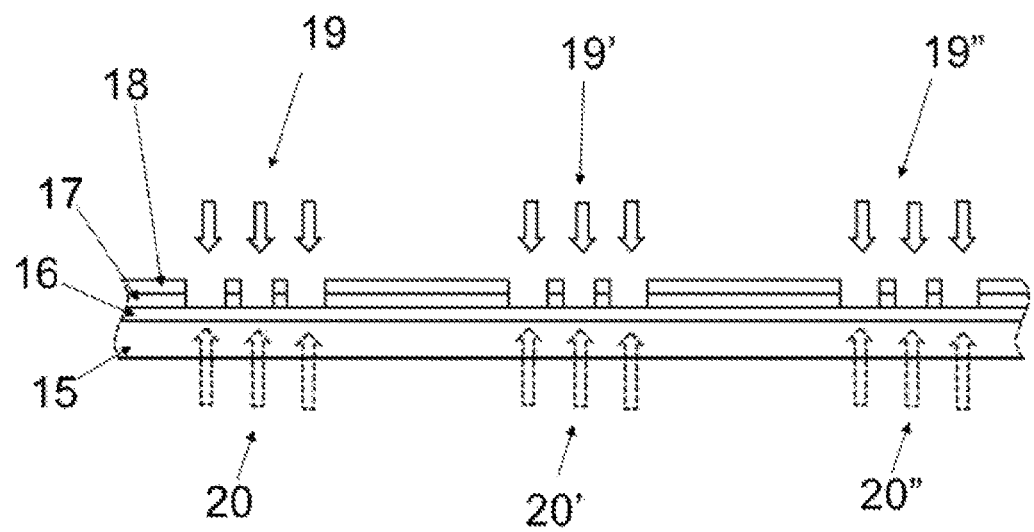
FIG. 5 depicts a cross-section of a thin film solar panel to illustrate example processing using the apparatus of FIG. 3.

FIG. 5 shows a cross section of a thin film solar panel. Substrate 15 which is usually made of glass is coated with thin layers of material; bottom contact layer 16, semiconductor layer 17 and top contact layer 18. 3 groups of 3 laser beams 19, 19' and 19" created by an optical head containing the optical arrangement shown in FIG. 3 for example are focussed on the top surface of the substrate. Motion of the optical head with respect to the substrate causes each beam to remove one or more of the layers to scribe grooves in the surface. The optical head can also be placed below the substrate and groups of beams 20, 20' and 20" caused to pass through the transparent substrate to remove the thin film materials from below. For the case shown in the figure all the laser beams within each group and all groups have the same focal spot size and power and hence all beams remove material to the same depth as shown. Such an arrangement whereby only the top 2 layers are removed and the bottom contact layer is left intact is appropriate for one preferred method for implementing an OSI process.

For thin film panels based on silicon or CdTe material where the bottom contact is a transparent dielectric material such as ITO, ZnO or FTO suitable lasers for performing the scribing operation shown in FIG. 5 are pulsed Nd:Yag or Nd:Vanadate DPSS lasers operating at the fundamental wavelength of 1064 nm or at the second harmonic wavelength of 532 nm. Such lasers are generally used from below the substrate but operation from the top side is also possible. For thin film panels based on CIGS materials where the bottom contact layer is generally opaque and the top contact transparent then beams are generally applied from the top side for performing the scribing operation shown in FIG. 5 and in this case IR lasers operating at 1064 nm or 1550 nm are appropriate.

FIG. 6

Figure 6:
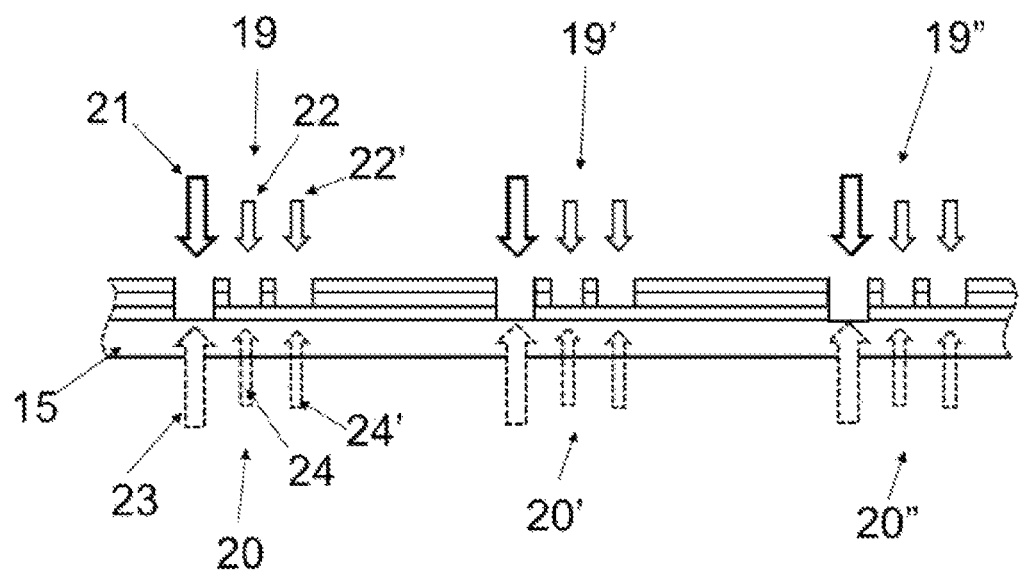
FIG. 6 depicts an arrangement similar to that in FIG. 5 but illustrates an alternative example processing involving sub-beams of different power.

FIG. 6 shows an arrangement similar to that shown in FIG. 5 in that groups of beams 19, 19' and 19" are focussed on the top, coated, side of the substrate 15 and/or other groups of beams 20, 20' and 20" pass through the substrate and are then focussed on the coating layers from below. In this case however the power in one of the beams 21 in each top side group is arranged to be higher than the others 22, 22' and/or the power in one of the beams 23 in each bottom side group is arranged to be higher than the others 24, 24', such that the grooves created by the more powerful beams are deeper than the grooves created by the lower power beams as shown. In an embodiment the arrangement is configured such that 2 of the beams in each group remove the top 2 layers and leave the bottom contact intact, and the third, more powerful beam, removes all 3 layers, leaving the substrate exposed. Such an embodiment is appropriate for another preferred method for implementing an OSI process.

The second DOE 8 may be configured to create spots within each group having different powers by dividing the power from the first beams asymmetrically. DOEs that achieve this result are well known and are readily available

FIG. 7

Figure 7:
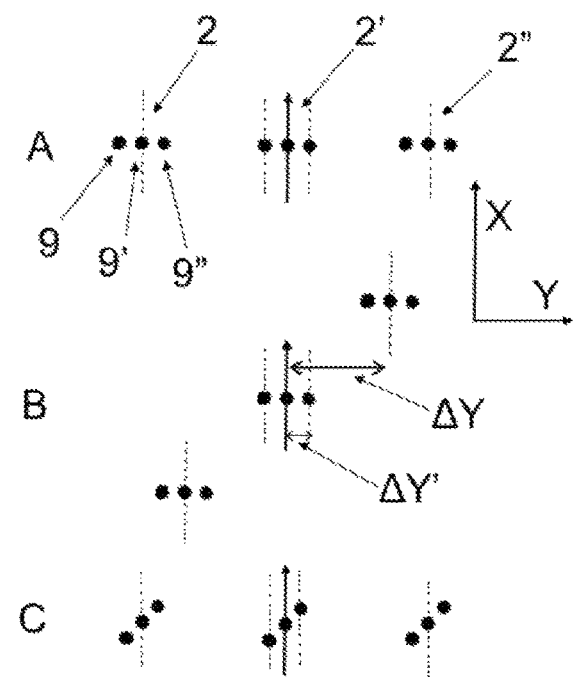
FIG. 7 depicts a top view of a solar panel corresponding to the spot arrangement of FIG. 4 to illustrate how the spacings between scribe lines can be varied by rotation of one or both DOEs.

FIG. 7 shows a top view of the solar panel corresponding to the optical arrangement shown in FIG. 4 and shows how the spacing between scribed lines created by the beams in a particular direction can be varied by rotation of one or both DOEs. FIG. 7A shows 3 groups of beams 2, 2' and 2", each group containing 3 sub-beams 9, 9' and 9", with all beams being focussed on the surface of a substrate which is moved along the X axis to create multiple lines of grooves parallel to the X axis. FIG. 7B shows the case where the first DOE is rotated about its axis (by about 45 degrees in this case) and the second DOE is not rotated compared to FIG. 7A. In this case the pattern of groups of beams on the substrate surface rotates by the same angle such that the separation between the groups of beams on the substrate surface ΔY in the Y direction perpendicular to the X axis is reduced and the separation between the groups of grooves created also reduces. The separation between the beams within each group in the Y direction remains unchanged. FIG. 7C shows the case where the second DOE is rotated about its axis (by about 45 degrees in this case) and the first DOE is not rotated compared to FIG. 7A. In this case the separation of the groups of beams on the substrate surface ΔY remains constant while the separation between the beams within each group in the Y direction is reduced. By independent rotation of both DOEs (by up to 90 degrees) the groove separation within each group and between groups in the Y direction can be reduced to any value (even down to zero) to match the required cell width and interconnect width on the panel

FIG. 8

Figure 8:
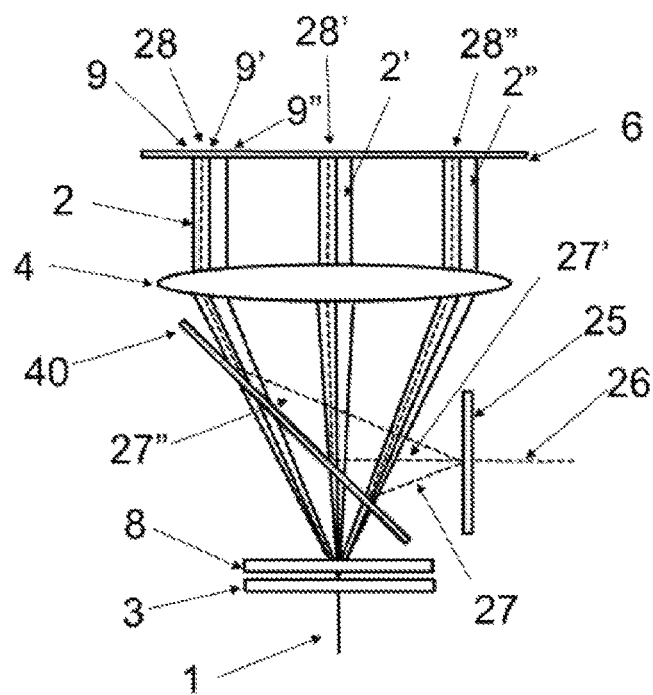
FIG. 8 depicts an arrangement in which two laser beams having different properties are split into sub-beams by separate DOEs and combined.

FIG. 8 shows an embodiment in which 2 laser beams with different properties are each split into sub-beams which are then combined on the surface of a substrate so as to more easily create grooves with different depth, as might be required by an OSI process for example. First DOE 3 splits first laser beam 1 into multiple second laser sub-beams and second DOE 8 placed close to first DOE 3 splits each of the second laser sub-beams into multiple third sub-beams. Lens 4 is situated such that all beams beyond lens 4 are parallel or close to parallel and are all focussed to create a row of groups of focal spots on the substrate surface 6, the separation between the groups being larger in this particular embodiment than the separation between the spots within each group. The figure shows 3 groups 2, 2' and 2" each having 3 focal spots 9, 9' and 9" but in practice there can be more or less groups (e.g. 4 or 2). In the embodiment shown there are 3 spots within each group, which may be convenient for certain OSI requirements, but in other embodiments the number can be more or less (e.g. 4 or 2). Third DOE 25 splits fourth laser beam 26 into multiple fifth laser sub-beams 27, 27', 27". In an embodiment, which is convenient for certain OSI applications for example, the number of fifth laser sub-beams is the same as the number of second laser sub-beams created by the first DOE (e.g. 3 as shown in the figure) but other numbers of fifth laser sub-beams are possible. Fifth laser sub-beams 27, 27', 27" are deflected by beam combiner optic 40 so as to pass through lens 4 to be focussed on the surface of substrate 6. In an embodiment, DOE 25 is designed such that the spacing between the fifth laser sub-beam focal spots 28, 28', 28" on the substrate are close to but slightly larger than the spacing between the groups of sub-beam focal spots defined by the rotation of the first DOE 3. Rotation of DOE 25 about its optical axis allows the spacing between the fifth sub-beam focal spots 28, 28', 28" and the spacing between the groups of sub-beam focal spots 2, 2', 2" defined by first DOE 3 in the direction perpendicular to the substrate motion direction to made exactly the same. In an embodiment, spatial and/or angular adjustment of beam combiner optic 40 is performed such that the fifth sub-beam focal spots are positioned on the substrate surface so as to exactly overlay one of the grooves created by each group of third sub-beams, thereby allowing an additional laser ablation operation to be performed on those grooves.

In an embodiment, the fourth laser beam 26 differs from first laser beam 1 in one or more of the following parameters: wavelength, pulse length, repetition rate or pulse energy. In an embodiment, which may be applicable to an OSI application for example, one of the following combinations of beams is used:
1) first laser beam 1 operates in the visible region at 532 or 527 nm while fourth laser beam 26 has a different wavelength operating in the IR region at 1030 or 1064 nm;
2) first laser beam 1 and fourth laser beam 26 both operate at the same visible or IR wavelength but first laser beam 1 has first pulse duration, first repetition rate and first pulse energy at least one of which differs from the second pulse duration, second repetition rate and second pulse energy of the fourth laser beam 26;
3) first laser beam 1 operates in the IR region around 1550 nm while fourth laser beam 26 operates at a different wavelength in the IR region at 1030 or 1064 nm.

For the case where first laser beam 1 and fourth laser beam 26 have different wavelengths then beam combiner optic 40 may for example be of a dichroic mirror type configured to transmit the first laser beam 1 (or sub-beams derived therefrom) fully and to reflect the fourth laser beam 26 (or sub-beams derived therefrom) fully. Such dichroic beam combiners are well known and are commonly used to combine visible and IR laser beams.

For the case where first laser beam 1 and fourth laser beam 26 have the same or similar wavelengths then beam combiner optic 40 may for example be of a polarization mirror type. In such an embodiment the polarization of first laser beam 1 (or sub-beams derived therefrom) at the surface of combiner 40 may be arranged to be p-polarization, such that the first laser beam 1 (or sub-beams derived therefrom) is fully transmitted, and the polarization of second laser beam 26 (or sub-beams derived therefrom) at the surface of beam combiner 40 may be arranged to be s-polarized, such that it is fully reflected. Such polarization sensitive beam combiners are well known and are commonly used to combine orthogonally polarized laser beams having the same wavelength.

If the first and fourth laser beams (or sub-beams derived therefrom) have different wavelength, since both are focussed by the same lens, to ensure both beams focus on the substrate surface control over the collimation of one or both beams may be required.

FIG. 9

Figure 9:
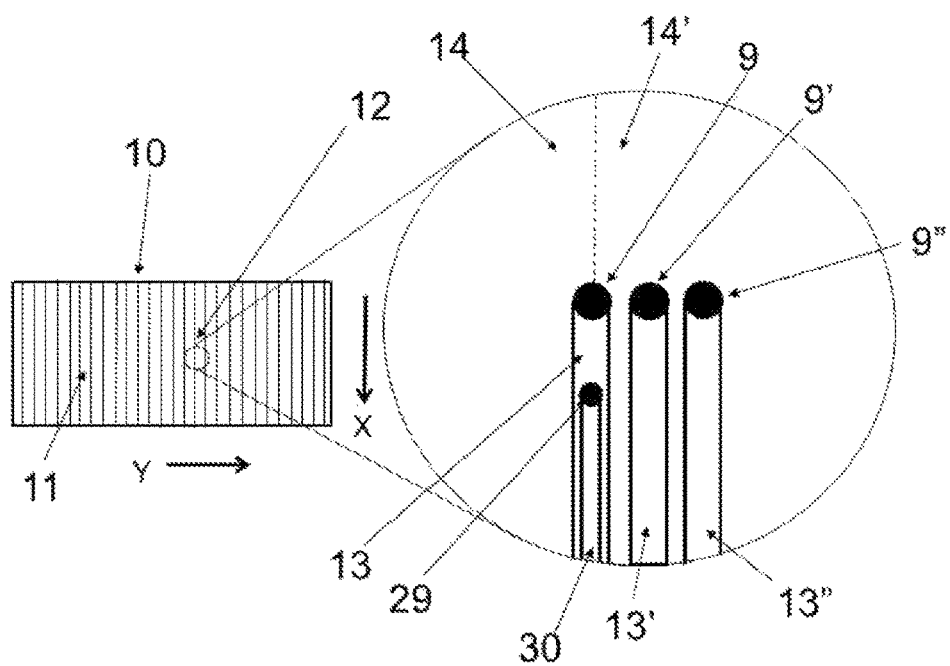
FIG. 9 depicts a top view of a thin film solar panel to illustrate how spots originating from different laser sources could be used for an OSI application.

FIG. 9 shows a top view of a thin film solar panel 10 and illustrates one arrangement of the groups of spots originating from the first and fourth laser beams as could be used for an OSI application for forming and interconnecting the cells. Thin film solar panel 10 is divided into multiple parallel cells 11 which are electrically interconnected in series. Area 12 on the panel is expanded on the right side of the figure to show a single group of focal spots 9, 9' and 9" created by the first laser beam. Movement of the panel in the X direction causes the beams to scribe grooves 13, 13' and 13" in the thin film layers on the panel to form the basis of an interconnect structure between cells 14 and 14'. If the laser power in all three focal spots is the same then all three grooves are formed to the same depth. In a typical OSI process this would mean removal of the top two layers leaving the lower electrode layer intact as shown in FIG. 5. In the present embodiment, the fourth laser beam 26 is formed into sub-beams and combined with the sub-beams from the first laser beam as shown in FIG. 8. The sub-beams created from the fourth laser beam are adjusted in position so that the focal spots are close to one of the focal spots in each group formed by the first laser beam and coincide with the scribe formed by that beam. The figure shows the focal spot 29 formed by one sub-beam from the fourth laser beam 26 positioned within the scribe 13 created by laser focal spot 9 formed by a sub-beam from the first laser beam 1. In an embodiment, the power in the laser beam forming focal spot 29 is adjusted so that as the panel is moved in the X direction it removes the lower electrode layer within the scribe 13 forming scribe 30 that penetrates to the substrate. Focal spot 29 may be arranged to be smaller than focal spot 9 so that scribe 30 is narrower than scribe 13, as shown in the figure. This arrangement has been found to be preferred in terms of maintaining good electrical performance of the cell interconnect structure. The distance between spots 9 and 29 on the panel surface can be any value but in practice since both beams originate from the same optics head and use common optics the preferred distance is in the range from a fraction of a mm to several mm.

FIG. 10

Figure 10:
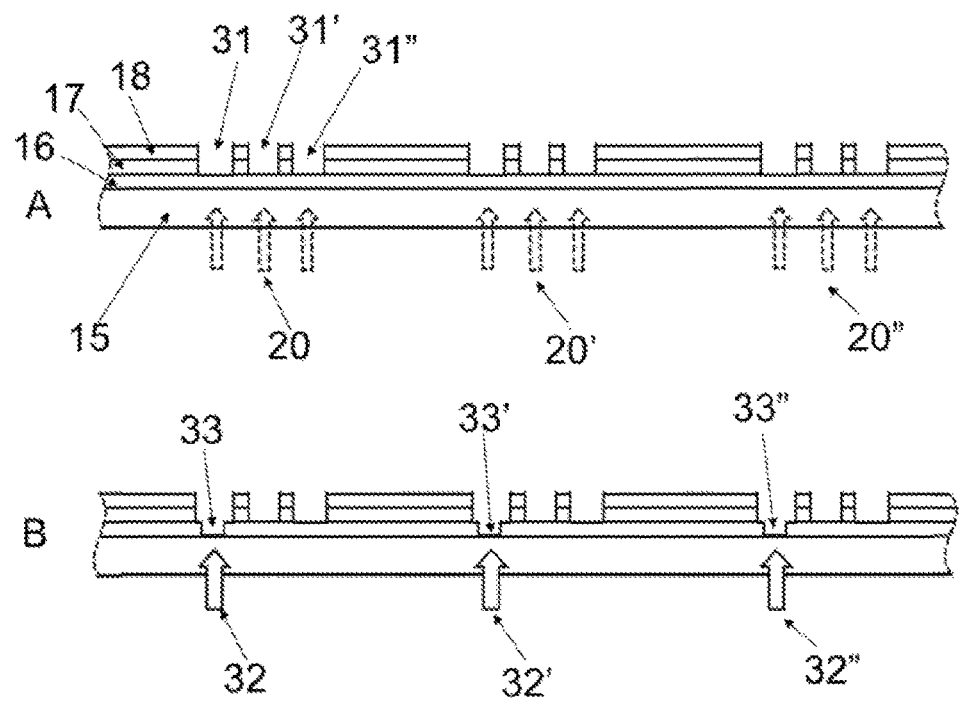
FIG. 10 depicts a cross section of a thin film solar panel to illustrate a two stage groove formation process corresponding to the arrangement of FIG. 9.

FIG. 10 shows a cross section of a thin film solar panel showing the two stage groove formation process corresponding to the optical arrangement shown in FIG. 9. Substrate 15, which may be made of glass for example, is coated with thin layers of material; bottom contact layer 16, semiconductor layer 17 and top contact layer 18. In FIG. 10A an optical head situated below the panel containing the optical arrangement shown in FIG. 8 forms three groups of three laser beams 20, 20', 20" originating from the first laser beam that are focussed through the substrate onto the layers from below. Motion of the optics head with respect to the substrate causes each beam to remove the upper two layers to scribe grooves 31, 31', 31". FIG. 10B shows the second stage of the groove formation process where additional beams 32, 32', 32" originating from the fourth laser beam are superimposed on one of the grooves in each group formed in the first stage to remove the lower electrode layer forming scribes 33, 33', 33" penetrating to the substrate. The figure shows beams for both groove formation stages passing through panel from below as this is a preferred arrangement especially for solar panels based on thin film silicon or CdTe but in practice other beam delivery arrangements such as all beams from the top side, sub-beams from the first laser beam from below with sub-beams from the fourth laser beam from on top or sub-beams from the first laser beam from on top with sub-beams from the fourth laser beam from below are all possible.

FIG. 11

Figure 11:
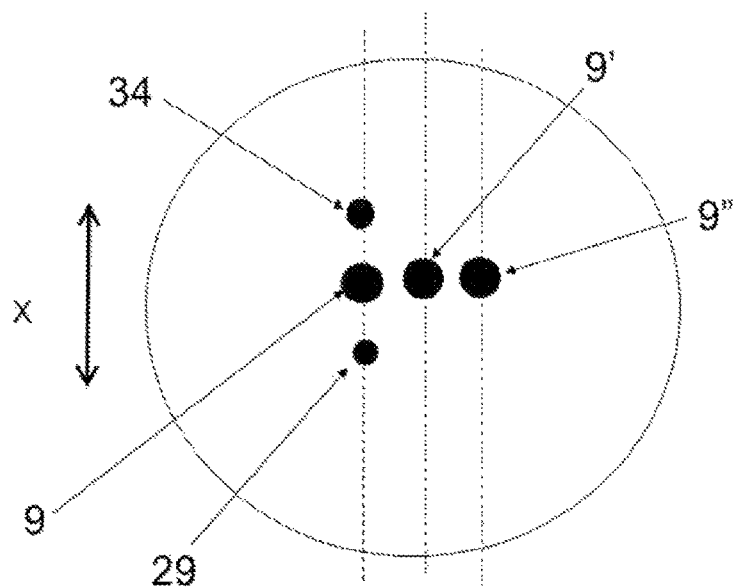
FIG. 11 depicts a top down view of a section of a solar panel to illustrate how a uni-directional two stage groove formation process such as that shown in FIGS. 9 and 10 can be developed to operate in both directions.

FIG. 11 shows a top down view of a section of a solar panel and illustrates how the uni-directional two stage groove formation process shown in FIGS. 9 and 10 can be developed to operate in both directions of travel of the substrate with respect to the laser process head. This can be achieved either by providing an additional sub-beam or by displacing an existing sub-beam from the fourth laser beam (or set of sub-beams, optionally one additional or displaced sub-beam for each of the sub-beams derived from the fourth laser beam). The figure shows three focal spots 9, 9', 9" formed from a group of sub-beams derived from the first laser beam, which are able to form the first stage of the dual stage groove formation process when the substrate moves in either direction with respect to the optics head. Focal spot 29 derived from the fourth laser beam is able to complete the second stage of the groove formation process only when the panel is moved in one X direction, in this case towards the bottom of the figure, as laser beam forming spot 29 has to follow laser beam forming focal spot 9. The addition of a further sub-beam (or the displacement of a sub-beam) from the fourth laser beam to form focal spot 34 on the opposite side of focal spot 9 to focal spot 29 enables two way operation. When the panel is moved in one X direction then focal spots 9 and 29 create the dual stage groove. When the panel is moved in the opposite X direction focal spots 9 and 34 form the dual stage groove.

FIG. 12

Figure 12:
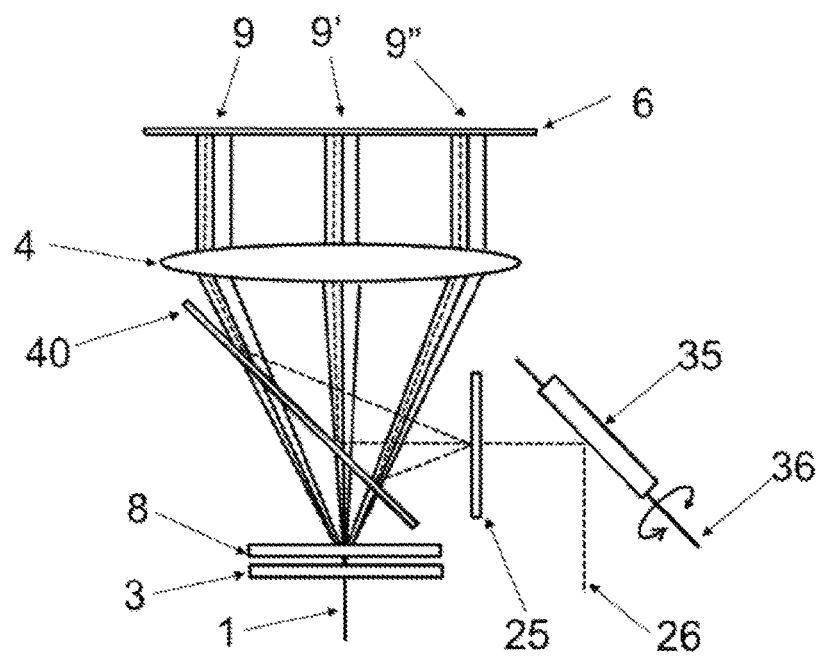
FIG. 12 depicts an example method for creating additional sub-beams for performing the processing illustrated in FIG. 11.

FIG. 12 shows one method for creating the two sub-beams required from the second laser to enable dual direction processing. As shown in FIG. 8 first DOE 3 and second DOE 8 split first laser beam 1 into groups of multiple third sub-beams that are focussed on the substrate by lens 4 to form groups of focal spots 9, 9', 9" and third DOE 25 splits fourth laser beam 26 into multiple fifth sub-beams that are combined by beam combiner 40 with the sub-beams from the first laser beam 1 to pass through the lens 4 to coincide with some of the third sub-beams on the substrate surface. A beam deflector 35, for example a mirror 35, is mounted on and has face parallel to axle 36 that lies in a plane perpendicular to the X axis and is directed such that rotation of mirror 35 about its axle causes the sub-beams created from the fourth laser beam to move in a direction parallel to the X direction on the substrate surface. Hence suitable rotation of mirror 35 causes the focal spot formed from the fourth laser beam to move from one side of the spot created by the sub-beam from the first laser beam to the other side as shown in FIG. 11. In an embodiment, such rotation takes place at the end of each pass of the optics head over the panel so enabling dual stage groove formation in both directions. Only small angular rotations of mirror 35 are required to deflect the sub-beams from the fourth laser beam by the required amount. For a lens 4 with focal length 100 mm, for a deflection of the sub-beams from the fourth laser beam of +/−1 mm with respect to the sub-beams from the first laser beam, angular motions of the mirror of only +/−5 mrads are required. Angular deflection of mirror 35 causes a movement of the sub-beams from the fourth laser beam 26 over the aperture of third DOE 25, beam combiner 40 and lens 4 but so long as mirror 35 is mounted close to third DOE 25 this movement is small and can be neglected. Similar motion of the sub-beam focal spots from the fourth laser beam with respect to the sub-beam spots from the first laser beam can be achieved by rotation of beam combiner 40 about an axis parallel to its face and perpendicular to X but in practice motion and control of this component is more difficult compared that of a separate component such as mirror 35.

FIG. 13

Figure 13:
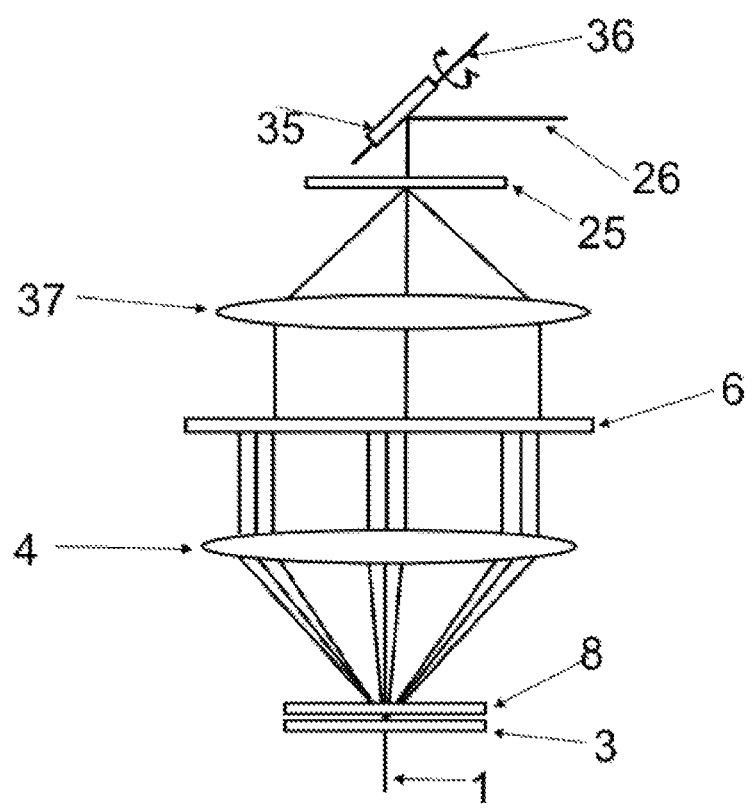
FIG. 13 depicts an optical arrangement whereby different laser beams are used to process a panel from opposite sides of the panel.

FIG. 13 shows an optical arrangement whereby first and second laser beams are directed to the panel from opposite sides. Such an arrangement is appropriate for certain material used in the manufacture of thin film solar panels. First laser beam 1 is split into multiple groups of sub-beams by first and second DOEs 3 and 8 which are focussed by first lens 4 onto the thin film coatings on solar panel 6 from one side. Second laser beam 26 is split by third DOE 25 into sub-beams which are focussed by second lens 37 onto the coatings on the panel from the opposite side. Rotation of mirror 35 about axis 36 causes the second laser focal spots to be deflected with respect to the first laser focal spots. Depending on the materials used to make the solar panel the coated side of the substrate can face either the first or the second laser beam.

Figure 14:
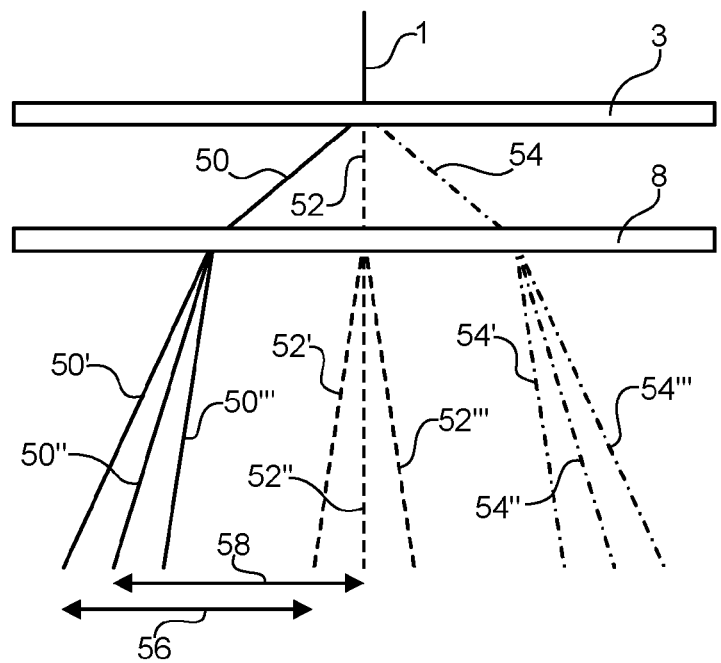
FIG. 14 depicts an arrangement in which the centres of different groups of sub-beams overlap with each other.
Figure 15:
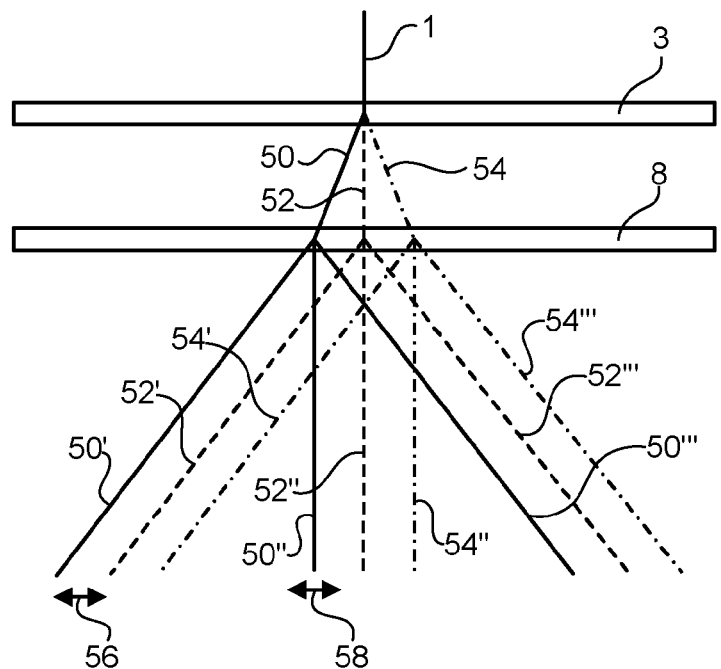
FIG. 15 depicts an arrangement in which the centres of different groups of sub-beams do not overlap with each other.

FIGS. 14 and 15

FIGS. 14 and 15 depict how the separation between different groups of sub-beams may be measured. Both figures depict how an input laser beam 1 is received by a first DOE 3. The first DOE 3 splits the beam into three second laser sub-beams 50, 52 and 54. The second laser sub-beams 50, 52 and 54 are then incident on a second DOE 8, positioned after the first DOE 3. The second DOE 8 splits each of the second sub-beams 50, 52 and 54 into a group of third sub-beams. The third sub-beams in the group derived from the second sub-beam 50 are labelled 50', 50" and 50'". The third sub-beams in the group derived from the second sub-beam 52 are labelled 52', 52" and 52'". The third sub-beams in the group derived from the second sub-beam 54 are labelled 54', 54" and 54'". As explained with reference to FIG. 3 above, further elements, such as a lens 4 (shown in FIG. 3 but not in FIG. 14 or 15), may be provided downstream of the second DOE 8 to direct the third sub-beams onto the workpiece and/or to combine the third sub-beams with other laser beams and/or otherwise modify their properties, as desired.

The separation between the centre lines of different groups of third sub-beams in a direction (horizontal within the plane of the page in the examples shown in FIGS. 14 and 15) can be measured in various ways. One way would be to measure a distance along the separation direction at a given distance from the second DOE 8 between a central point in each group of sub-beams (marked by arrow 58). Alternatively, a distance between corresponding sub-beams in different groups may be measured. Corresponding sub-beams may be sub-beams of the same diffraction order, for example (e.g. zeroth order, first order, second order, etc.). An example of such a measure is illustrated by arrow 56 (and arrow 58, where coincidentally a central sub-beam lies along the central point of the group). Alternatively, the separation may be measured by comparing the angular difference between central points of the angular distribution of sub-beams from different groups or the angular difference between corresponding sub-beams in different groups.

In an embodiment, the first DOE 3 is configured to provide a coarse adjustment and the second DOE 8 is configured to provide a fine adjustment. In such an embodiment the first DOE 3 will be such as to cause a wider splitting of an input laser beam than the second DOE 8. This has the result that a change in the separation of the groups of third sub-beams caused by a given rotation of the first DOE 3 will be larger than the change in the separation between individual third sub-beams in each group caused by the same rotation of the second DOE 8.

In an alternative embodiment, the first DOE 3 is configured to provide a fine adjustment and the second DOE 8 is configured to provide a coarse adjustment. In such an embodiment the first DOE 3 will be such as to cause a narrower splitting of an input laser beam than the second DOE 8. This has the result that a change in the separation of the groups of third sub-beams caused by a given rotation of the first DOE 3 will be smaller than the change in the separation between individual third sub-beams in each group caused by the same rotation of the second DOE 8. In practice all laser beams have finite size ranging from a few mm diameter to many mm in diameter and because of mechanical mounting requirements the distance between the first and second DOEs 3 and 8 along the beam path can be several 10 s of mm. This means that the overall size of the beam pattern at the second DOE 8 can be relatively large if the beams are split widely by the first DOE 3, which increases the minimum size (e.g. diameter) required for the second DOE 8. Arranging for the first DOE 3 to be finer than the second DOE 8 decreases the overall size of the beam pattern at the second DOE 8, which allows the use of a smaller diameter second DOE 8 and also use of a smaller diameter beam splitter as shown in FIG. 8. This makes mounting of these components simpler.

When viewed along a given axis perpendicular to the optical axis of the DOEs 3 and 8 (e.g. perpendicular to the page in the orientation shown in FIGS. 14 and 15), the groups of third sub-beams may or may not overlap with each other, depending in general on the relative rotational positions of the DOEs 3 and 8. FIG. 14 depicts an example situation in which the centre lines of the groups of beams do not overlap. FIG. 15 depicts an example situation in which the centre lines of groups of beams do overlap.

Unless explicitly stated to the contrary, where reference is made herein to separations between beams or sub-beams, which always have a finite lateral spread or beam width, this is to be understood as referring to separations between centre lines of those beams or sub-beams.

The invention claimed is:

1. An apparatus for forming a plurality of scribe grooves in a workpiece using direct laser scribing, the apparatus comprising:
    a process head on which is mounted a first diffractive optical element and a second diffractive optical element, the first diffractive optical element being arranged to receive a first laser beam and to divide the first laser beam into a plurality of second laser sub-beams and the second diffractive optical element being arranged to receive said plurality of second laser sub-beams and to divide the second laser sub-beams into two or more groups of third laser sub-beams; and
    a workpiece moving device configured to move the workpiece relative to the process head in a direction parallel to a first axis in order to form, using the third laser sub-beams, a plurality of scribe grooves extending along the first axis, wherein
    the first diffractive optical element and the second diffractive optical element are configured such that the separation of the groups in a direction perpendicular to the first axis is adjustable by rotation of the first diffractive optical element about its optical axis,
    the first diffractive optical element and the second diffractive optical element are further configured such that the separation of the third laser sub-beams within each group in the direction perpendicular to the first axis is adjustable by rotation of the second diffractive optical element about its optical axis, thereby allowing separations between the scribe grooves, formed by the third laser sub-beams and the relative movement between the workpiece and the process head parallel to the first axis, to be adjusted, and
    the first diffractive optical element and the second diffractive optical element are angularly positioned such that the separation, in the direction perpendicular to the first axis, of the groups is non-zero, and the separation, in the direction perpendicular to the first axis, of the third laser sub-beams within each group is non-zero.

2. The apparatus according to claim 1 comprising a lens arranged to receive said plurality of groups of third laser sub-beams from said second diffractive optical element, the position of the lens along its optical axis being adjustable so that the groups of laser sub-beams output therefrom and the laser sub-beams within each group are substantially parallel.

3. The apparatus according to claim 1 having a beam combiner and a third diffractive optical element arranged to receive a fourth laser beam having at least one property different from the first laser beam and to divide the fourth laser beam into a plurality of fifth laser sub-beams, the separation of the fifth laser sub-beams in a direction perpendicular to the first axis being adjustable by rotation of the third diffractive optical element about its optical axis, said beam combiner being arranged to combine the groups of third laser sub-beams leaving the second diffractive optical element with said fifth laser sub-beams leaving said third diffractive optical element.

4. The apparatus according to claim 3, configured such that at least one of the third laser sub-beams forms a first spot on the workpiece, one of the fifth laser sub-beams forms a second spot on the workpiece, the first and second spots together lie on a line that is parallel with said first axis, and the first and second spots are spaced apart from each other along said line.

5. The apparatus according to claim 4, further comprising a beam deflector for controlling a direction of incidence of the fourth laser beam onto the third diffractive optical element and/or beam combiner such that the separation between the first and second spots can be varied while maintaining the alignment along the direction parallel with said first axis.

6. The apparatus according to claim 5, wherein the beam deflector comprises a mirror mounted so as to be rotatable about an axis lying in a plane perpendicular to said first axis.

7. The apparatus according to claim 5, wherein the beam deflector is configured to allow the second spot to be selectively positioned on one side or the other side of the first spot along a processing line, thereby to allow the first spot to be made selectively to lead or lag, as required, the second spot along the processing line for both of opposite directions of movement of the workpiece along said first axis.

8. The apparatus according to claim 3 in which the beam combiner comprises a dichroic mirror or polarization mirror.

9. The apparatus according to claim 1, wherein the separation of the groups of beams created by the first diffractive optical element is greater than or less than the separation of the third laser sub-beams created by the second diffractive optical element.

10. The apparatus according to claim 1 having two or more process heads each process head having first and second diffractive optical elements mounted thereon and being moveable relative to a workpiece for carrying out direct laser scribing of the workpiece.

11. The apparatus according to claim 1 having a first laser source arranged to provide said first laser beam to one or each of the process heads.

12. The apparatus according to claim 11 having a second laser source for providing said fourth laser beam to one or each of the process heads.

13. The apparatus according to claim 1, wherein the first and second diffractive optical elements are configured such that the adjustment in the separation of the groups of third sub-beams provided by the first diffractive optical element is coarser than the adjustment in the separation between the third laser sub-beams in each group provided by the second diffractive optical element.

14. The apparatus according to claim 1, wherein the first and second diffractive optical elements are configured such that the adjustment in the separation of the groups of third sub-beams provided by the first diffractive optical element is finer than the adjustment in the separation between the third laser sub-beams in each group provided by the second diffractive optical element.

* * * * *